Figure 1:
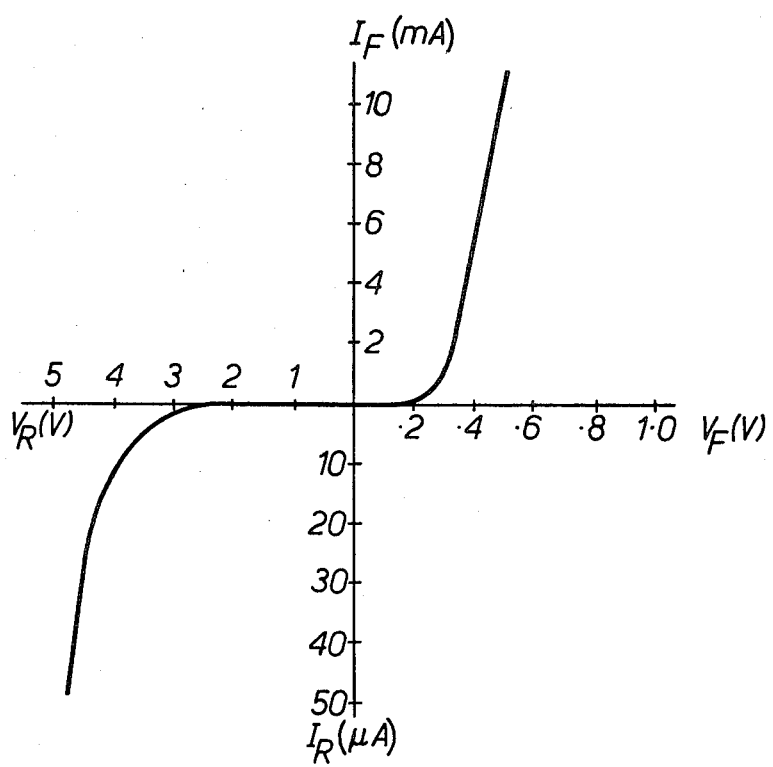

United States Patent [19]

Owen

[11] 4,400,630
[45] Aug. 23, 1983

[54] FREQUENCY MULTIPLIERS

[75] Inventor: David P. Owen, Dunstable, England

[73] Assignee: Marconi Instruments Limited, Chelmsford, England

[21] Appl. No.: 214,026

[22] Filed: Dec. 8, 1980

[30] Foreign Application Priority Data

Dec. 6, 1979 [GB] United Kingdom ................. 7942171

[51] Int. Cl.³ ........................................... H03B 19/00
[52] U.S. Cl. ................................... 307/219.1; 328/20; 307/310; 307/317 A
[58] Field of Search ............. 328/20; 307/225 R, 310, 307/317 A

[56] References Cited

U.S. PATENT DOCUMENTS

| 3,044,004 | 7/1962 | Sicard | 328/20 X |
|---|---|---|---|
| 3,161,816 | 12/1964 | Holcomb | 328/20 X |
| 3,261,991 | 7/1966 | Lash | 328/20 X |
| 3,398,297 | 8/1968 | Huen | 307/220 |
| 3,623,925 | 11/1971 | Jenkins et al. | 307/317 A |
| 3,947,706 | 3/1976 | Holmes | 307/310 |

Primary Examiner—John S. Heyman
Attorney, Agent, or Firm—Spencer & Kaye

[57] ABSTRACT

A frequency multiplier uses a pair of Schottky diodes to rectify an applied signal, with the rectified waveforms provided by both diodes being combined to produce an output signal having a predominant frequency of twice the applied frequency. In order to prevent distortion occuring at low signal levels, a d.c. bias is applied to the diodes so as to bias them at their threshold values. The effect of temperature variations on the diodes is minimized by using a further diode to determine the effective value of the bias voltage.

3 Claims, 4 Drawing Figures

FREQUENCY MULTIPLIERS

This invention relates to frequency multipliers and is specifically concerned with multipliers which are able to generate a signal having a frequency which is an integral even multiple of a frequency applied to it. Frequency multiplication can be achieved by means of a suitable diode network; it is common to use such a network to multiply a frequency by a factor of two, in which case the network is usually termed a frequency doubler, but in principle higher order even multiples can be obtained by the use of appropriate harmonic filters or by cascading a number of frequency doublers.

The use of such a frequency multiplier can introduce amplitude distortion into the frequency multiplied signal and when the signal whose frequency is multiplied is itself an amplitude modulated signal, the distortion to which the amplitude modulation is subject can be particularly significant. This effect can result in degradation of the information represented by the amplitude modulation and must be minimised. It is believed that the distortion often stems primarily from the non-linearity of the transfer characteristic of the diodes forming part of the frequency multiplier. In principle, the distortion can be reduced by driving the diodes at relatively high levels so that they can operate on more linear portions of their transfer characteristic, but such an expedient is very wasteful of power and it is not always practicable to provide an input signal having a level which is sufficiently high for this purpose. The present invention seeks to provide an improved frequency multiplier.

According to this invention a frequency multiplier includes a diode network having a plurality of diodes each of which is arranged to rectify an a.c. signal applied to the network, the rectified signals being combined to produce a signal having an even multiple of the frequency of the applied signal; and means for applying a voltage bias to each of said diodes so as to forward bias them to at least approximately their current conduction threshold.

Although the diode network may comprise four diodes connected in a ring, it is preferred to provide only two diodes each of which is arranged to act as a half wave rectifier. Diodes generally exhibit a marked knee in their forward conduction characteristic and below this knee the current which the diode passes is very low in relation to the forward voltage bias applied to it. Typically the voltage knee is at about 200 mVs for Schottky barrier diodes. The invention is particularly applicable to very high frequencies, typically of the order of several hundred MHz, and at such high frequencies it is necessary to use diodes which possess a very low internal reactance. At the present time, Schottky diodes are very suitable for this purpose and these exhibit a very pronounced knee in their forward conduction characteristics so that the current conduction threshold can be readily identified with some precision.

Preferably each of the diodes in the diode network is provided with common voltage bias means.

Preferably the bias means comprises a d.c. bias voltage which is applied to the diodes in the diode network via a low pass filter. The low pass filter is arranged to have a cutoff frequency well below the frequency of the signal applied to the frequency multiplier.

Preferably again the low pass filter comprises an inductor connected in series between the diodes and a voltage reference point.

The voltage reference point may be provided by a simple potentiometer in which the relative values of serially connected resistors determine the value of the bias voltage.

Preferably, however, the bias voltage is a function of temperature dependent variations in the forward conduction characteristic of said diodes. This can be achieved by incorporating a further diode into the voltage bias means so that temperature dependent variations in its forward conduction characteristic modify the voltage bias applied to the diodes in the diode network.

Figure 3:
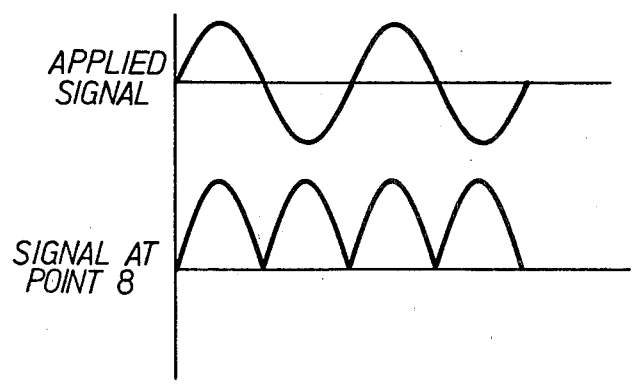
Figure 2:
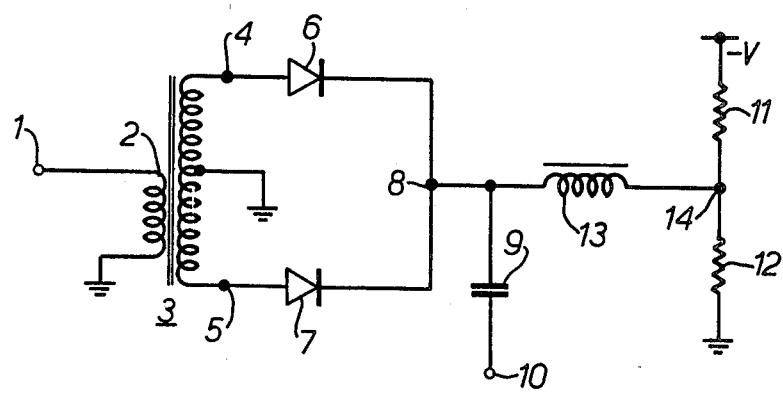
Figure 4:
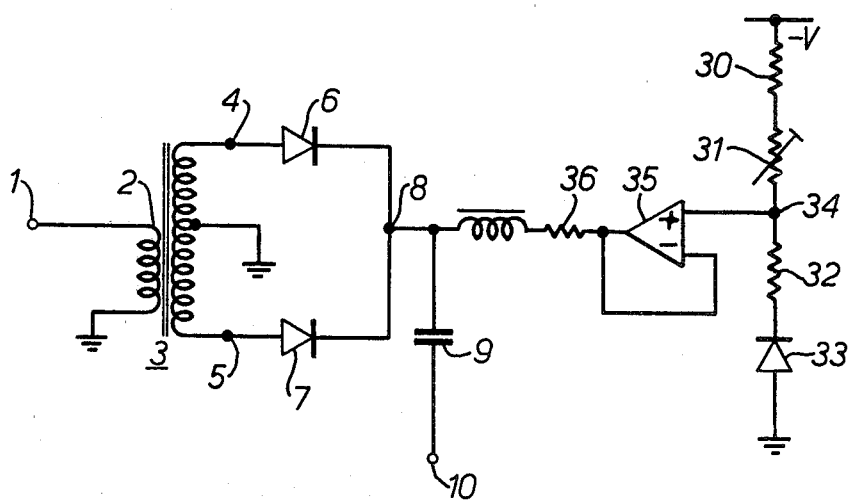

The invention is further described by way of example with reference to the accompanying drawings in which, FIG. 1 illustrates the transfer characteristic of a diode which typically forms part of a frequency multiplier, FIG. 2 illustrates a frequency multiplier in accordance with the present invention, FIG. 3 is an explanatory diagram, and FIG. 4 illustrates a modified frequency multiplier.

In a frequency multiplier circuit which is capable of operating at very high input frequencies, typically about 500 MHz, it is necessary to use diodes having a very high frequency response. Typically, a Schottky barrier diode is used, since these can provide satisfactory rectification up to very high frequencies in excess of 10 GHz. A typical transfer characteristic of a silicon Schottky barrier diode is illustrated in FIG. 1 and it will be seen, with reference to the forward conduction portion of characteristic, that negligible forward current ($I_F$) flows until the forward voltage ($V_F$) exceeds about 0.2 volts. Above this voltage threshold value the forward current rises rapidly and about 0.4 volts the transfer characteristic becomes linear. It will thus be seen that the transfer characteristic exhibits marked knee in the region of 0.2 volts and that no significant output current flows through the diode until this input voltage is exceeded. In practice, this property of the diode can give rise to serious difficulties, since for low level input signals much of the signal is lost, as the threshold voltage has to be overcome before any significant output current is obtained. Additionally, the acute non-linearity of the transfer characteristic in the region of the knee can introduce distortions. Distortion is particularly noticeable if the input signal is amplitude modulated, because the existence of the threshold voltage will result in an output modulation depth being much greater than the applied input modulation depth. This distortion stems from the fact that in order to obtain 100% amplitude modulation depth at the output of the diode, the input amplitude modulation troughs need only reach the threshold voltage (typically 0.2 volts) of the diode in order to give a zero level in the multiplied output signal.

Referring to FIG. 2, there is shown therein the frequency doubler in accordance with the present invention, which enables the distortion referred to above to be significantly reduced. An input signal having a frequency which is to be doubled in value is applied to an input terminal 1, which is connected to the primary winding 2 of a transformer 3. The transformer 3 is such as to produce two output signals at points 4 and 5, which are of equal amplitude, but opposite polarity. These signals are passed via respective Schottky barrier diodes 6 and 7, which rectify the signals and the rectified signals are combined at point 8 to produce the waveform illustrated in FIG. 3. Each diode 6 and 7 conducts on alternate half cycles of the applied waveform, so that the combined signal is rich in the second harmonic. This signal is passed via a capacitor 9 to an output terminal 10.

The transformer 3 could be replaced by a semiconductor circuit performing the circuit function or by an alternative transformer configuration performing the same function.

As so far described the frequency doubler is fairly conventional, but in addition a potential divider comprising resistors 11 and 12 and a low pass filter consisting of an inductor 13 are provided. The relative values of the resistors 11 and 12 are chosen in relation to a negative supply potential $-V$ so as to produce a voltage reference at point 14, which is at least approximately equal to the threshold value of the forward conduction characteristic of the diodes 6 and 7. The d.c. voltage present at point 14 is transferred via the inductor 13 (assumed to have a substantially zero d.c. resistance) to the point 8 so as to provide a permanent bias for the diodes 6 and 7.

Thus if even a very low level input signal is applied to the diodes 6 and 7 they will immediately conduct and generate a corresponding output signal. The distortion referred to above which is particularly applicable to amplitude modulation is not wholly eliminated, since the shape of the diode characteristic in the region of the knee is not abrupt, but is in fact, a curve—this profile is often termed a soft characteristic. Assuming that terminal 10 feeds into a 50Ω input impedance, the value of resistors 11 and 12 are typically 2.4kΩ and 51Ω.

Without the application of a forward voltage bias to the diodes 6 and 7 it has been found that a 0 dB input level requires 40% input amplitude modulation depth to achieve 80% output amplitude modulation. With bias applied as shown in FIG. 2, 80% output amplitude modulation was achieved with 72% input amplitude modulation, and additionally the amplitude modulation distortion was improved from 3% to 0.5% and the insertion loss was improved by 6 dB.

An additional effect which can degrade the performance of a frequency doubler stems from the temperature co-efficient of the threshold voltage of the diodes 6 and 7, as the value of the threshold voltage changes with temperature. Consequently, the amplitude modulation of an amplitude modulated input signal will also change. This effect can be reduced by the frequency doubler illustrated in FIG. 4. It will be seen that this Figure is very similar to the circuit shown in FIG. 2 except that the d.c. forward bias potential is generated in a different manner. A potential divider consisting of resistors 30, 31 and 32 is provided, with a further Schottky barrier diode 33 being connected in series with them. The reference potential is developed at point 34 and its value is transferred via a unity gain amplifier 35, which includes the resistor 36 to the point 8. It is assumed that the diodes 6, 7 and 33 possess matched characteristics so that any temperature change affects all diodes in a similar manner. It will thus be apparent that temperature variations which affect the diode 33 results in a corresponding modification of the d.c. forward bias potential produced at point 8, thereby modifying the threshold value for the diodes 6 and 7. The actual value of the resistor 36 is chosen so as to optimise the amplitude modulation response.

The multiplied frequency obtained at output terminal 10 corresponds in profile to that present at point 8 and shown in FIG. 3. Although it is not a smooth sine wave it is nevertheless quite acceptable for many purposes. If a more pure waveform is required a filter can be provided at output terminal 10 so as to pass the doubled frequency whilst attenuating higher harmonics. If the input signal varies over a wide frequency range, a number of suitable output filters can be provided, with the appropriate filter being switched in as required. Alternatively a single tracking filter could be used, with a variable frequency response.

Because the output signal at point 10 is not a pure sine wave, narrow band filters can be used to obtain higher order even multiples of the applied signal, but of course the amplitude of the even harmonics decreases significantly as the order number arises.

I claim:

1. A frequency multiplier including a diode network comprising two Schottky barrier diodes connected together via corresponding electrodes to a common output point and each of which is arranged to rectify a high frequency, amplitude modulated signal applied to the network, the rectified signals being combined at the output point to produce an alternating signal having an even multiple of the frequency of the applied signal; means for providing a d.c. voltage bias of an amplitude sufficient to forward bias said diodes to at least their current conduction threshold; and a low pass filter composed of inductor means connected in series between said d.c. voltage bias providing means and said common output point, said filter means having an upper cutoff frequency below the frequency of the signal applied to said network, for supplying the d.c. voltage bias to said common output point while isolating said d.c. voltage bias providing means from the alternating signal produced at said common output point in order to cause the d.c. voltage bias to permanently bias said diodes and to reduce distortion of the amplitude modulation of the signal applied to said network.

2. A frequency multiplier as claimed in claim 1 and wherein the bias voltage is a function of temperature dependent variations in the forward conduction characteristic of said diodes.

3. A frequency multiplier as claimed in claim 2 and wherein the voltage bias means includes a further diode arranged so that temperature dependent variations in its forward conduction characteristic modify the voltage bias applied to the diodes in the diode network.

* * * * *